(12) United States Patent
Kuo et al.

(10) Patent No.: US 9,590,607 B2
(45) Date of Patent: Mar. 7, 2017

(54) INPUT BUFFER CIRCUIT (71) Applicant: MEDIATEK INC., Hsin-Chu (TW)

(72) Inventors: Bo-Jyun Kuo, Hsinchu (TW); An-Siou Li, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/922,202

(22) Filed: Oct. 26, 2015

(65) Prior Publication Data
US 2016/0261260 A1    Sep. 8, 2016

Related U.S. Application Data (60) Provisional application No. 62/128,572, filed on Mar. 5, 2015.

(51) Int. Cl.
H03K 3/00    (2006.01)
H03K 5/24    (2006.01)
(52) U.S. Cl.
CPC .................. H03K 5/2481 (2013.01)
(58) Field of Classification Search
CPC .................................. H03K 5/2481
See application file for complete search history.

(56) References Cited

U.S. PATENT DOCUMENTS

| | | | | |
|---|---|---|---|---|
| 4,638,260 A * | 1/1987 | Hamley | ............ | H03F 1/34 330/254 |
| 5,825,819 A * | 10/1998 | Cogburn | ............ | H03F 3/3076 330/255 |
| 7,579,911 B2 * | 8/2009 | Suzuki | ............ | H03F 3/3022 330/253 |
| 7,622,986 B2 * | 11/2009 | Pan | ............ | G11C 7/1078 327/52 |
| 8,000,672 B2 * | 8/2011 | Sumesaglam | ............ | G11C 7/065 327/52 |

* cited by examiner

Primary Examiner — Kenneth B Wells
(74) Attorney, Agent, or Firm — Winston Hsu; Scott Margo (57) ABSTRACT An input buffer circuit comprising: a first current source; a first differential control circuit, configured to generate a first bias voltage at the first couple terminal according to the input signals, and configured to generate first control signals according to the input signals; a second current source; a second differential control circuit, configured to generate a second bias voltage at the second couple terminal according to the input signals, and configured to generate second control signals according to the input signals; a third current source, configured to provide a first current according to the second bias voltage; a first differential output circuit, configured to receive the first control signals to generate output signals; a fourth current source, configured to drain a second current according to the first bias voltage; and a second differential output circuit, configured to receive the second control signals to generate the output signal.

16 Claims, 5 Drawing Sheets

|  | Vref | Operation speed | Operation performance |
|---|---|---|---|
| Standard 1 | 0.9V | 2.7Gbps | Good |
| Standard 2 | 0.6V | 1.9Gbps | Good |
| Standard 3 | 0.18V | 3.2Gbps | Fail |

INPUT BUFFER CIRCUIT

CROSS REFERENCE TO RELATED APPLICATIONS

This application claims the benefit of U.S. Provisional Application No. 62/128,572, filed on Mar. 5, 2015, the contents of which are incorporated herein by reference.

BACKGROUND

A system always comprises at least one receiver for receiving signals. Conventionally, the receiver may need to operate at different operation speeds to support different specifications. However, the receiver needs to operate in a suitable reference voltage range such that it can operate at a desired operation speed.

Figure 1:
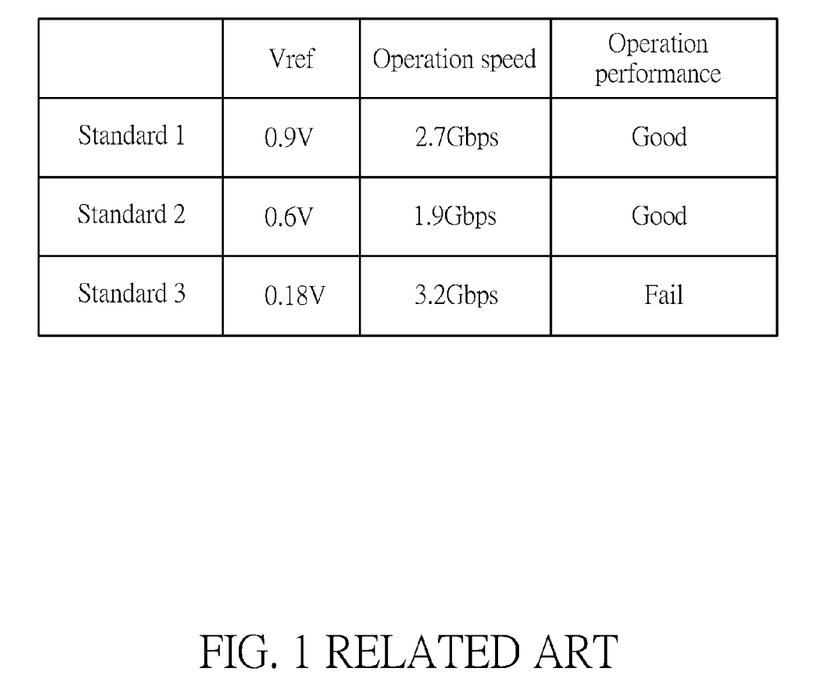
FIG. 1 is a schematic diagram illustrating operations for a conventional receiver.

FIG. 1 is a schematic diagram illustrating operations for a conventional receiver. As illustrated in FIG. 1, if the receiver is desired to operate at an operation speed 2.7 Gbps to meet the requirements of Standard 1, it needs to operate at a reference voltage equaling to or higher than 0.9v, or the operation performance for the receiver will be bad. Similarly, if the receiver is desired to operate at an operation speed 1.9 Gbps to meet the requirements of Standard 2, it needs to operate at a reference voltage equaling to or higher than 0.6v, or the operation performance for the receiver will be bad.

In another example in FIG. 1, the receiver is desired to operate at an operation speed of 3.2 Gbps to meet the requirements of Standard 3. However, the reference voltage is too low, such that the receive can only operate at an operation speed of 1.6 Gbps, thus the performance for the receiver is bad.

Accordingly, if the reference voltage tolerance range is too narrow, which indicates the range that the receiver can have good operation is too narrow, the performance for the receiver may always be non-optimized.

SUMMARY

One objective of the present application is to provide an input buffer circuit which can extend the reference voltage tolerance range.

One embodiment of the present application discloses an input buffer circuit, which comprises: a first current source; a first differential control circuit, coupled to the first current source at a first couple terminal, configured to receive input signals and to generate a first bias voltage at the first couple terminal according to the input signals, and configured to generate first control signals according to the input signals; a second current source; a second differential control circuit, coupled to the second current source at a second couple terminal, configured to receive the input signals and to generate a second bias voltage at the second couple terminal according to the input signals, and configured to generate second control signals according to the input signals; a third current source, comprising a first terminal coupled to a first predetermined voltage level, and comprising a second terminal, wherein the third current source provides a first current according to the second bias voltage; a first differential output circuit, coupled to the second terminal of the first current source to receive the first current, configured to receive the first control signals to generate output signals; a fourth current source, comprising a first terminal, and comprising a second terminal coupled to the second predetermined voltage level, wherein the fourth current source drains a second current according to the first bias voltage; and a second differential output circuit, coupled to the first terminal of the fourth current source, configured to receive the second control signals to generate the output signal.

Another embodiment of the present application discloses an input buffer circuit, which comprises: a first current source; a first differential control circuit, coupled to the first current source at a first couple terminal, configured to receive one of the input signals and to generate a first bias voltage at the first couple terminal according to the input signal, and configured to generate first control signals; a second current source; a second differential control circuit, coupled to the second current source at a second couple terminal, configured to receive one of the input signals and to generate a second bias voltage at the second couple terminal according to the input signal, and configured to generate second control signals; a first adjustable resistor, comprising a first terminal coupled to the first predetermined voltage, and a second terminal, wherein a resistance value of the first adjustable resistor changes corresponding to the second bias voltage; an adjustable resistance module, coupled to the second terminal of the first adjustable resistor, wherein a resistance value of the adjustable resistance module changes corresponding to the second bias voltage; a second adjustable resistor, comprising a first terminal, and a second terminal coupled to the second predetermined voltage, wherein a resistance value of the second adjustable resistor changes corresponding to the first bias voltage; a transconductance providing circuit, coupled between the adjustable resistance module and the second adjustable resistor, configured to provide transconductance.

In view of above-mentioned embodiments, the reference voltage tolerance range can be extended, thus the requirements for receivers following different standards may be met even if only one constant reference voltage is provided. Also, better reference voltage tolerance ranges can be acquired even if the reference voltages are different.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
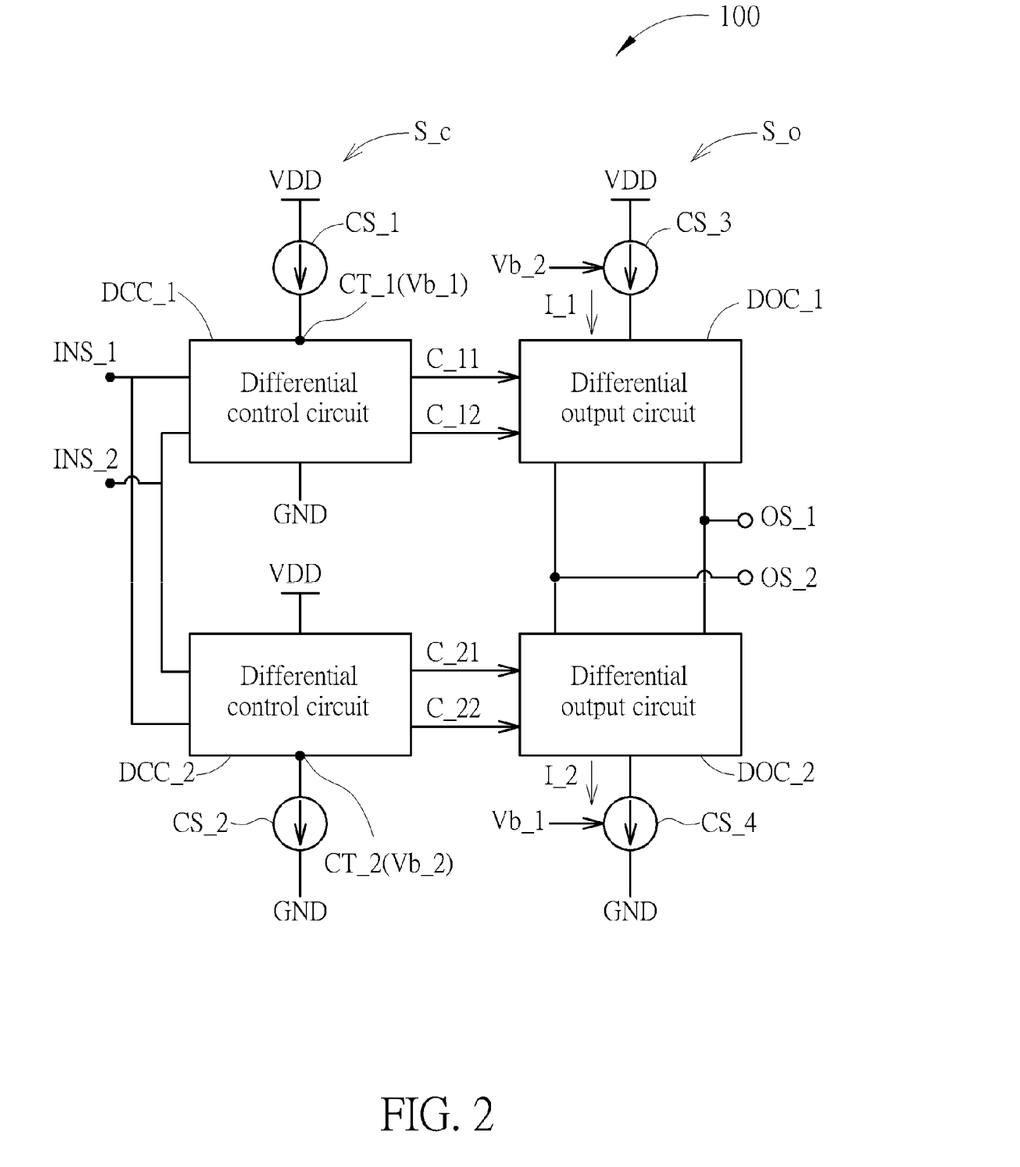
FIG. 2 is a block diagram illustrating an input buffer circuit according to one embodiment of the present application.

FIG. 2 is a block diagram illustrating an input buffer circuit according to one embodiment of the present application. As depicted in FIG. 2, the input buffer circuit 100 comprises a control stage S_c and an output stage S_o. The control stage S_c comprises a first current source CS_1, a first differential control circuit DCC_1, a second current source CS_2, and a second differential control circuit DCC_2. The first differential control circuit DCC_1 is coupled to the first current source CS_1 at a first couple terminal CT_1, and configured to receive input signals INS_1, INS_2, which form a differential signal. The first differential control circuit DCC_1 generates a first bias voltage Vb_1 at the first couple terminal CT_1 according to the input signals INS_1, INS_2, and generates first control signals C_11, C_12 according to the input signals INS_1, INS_2, which form a differential signal. The second differential control circuit DCC_2 is coupled to the second current source CS_2 at a second couple terminal CT_2, configured to receive the input signals INS_1, INS_2 and to generate a second bias voltage Vb_2 at the second couple terminal CT_2 according to the input signals INS_1, INS_2. The second differential control circuit DCC_2 further generates second control signals C_21, C_22 according to the input signal INS_1, INS_2, which form a differential signal as well.

The output stage S_o comprises a third current source CS_3, a first differential output circuit DOC_1, a fourth current source CS_4 and a second differential output circuit DOC_2. The third current source CS_3 comprises a first terminal coupled to a first predetermined voltage level VDD, and comprises a second terminal. The third current source CS_3 provides a first current I_1 according to the second bias voltage Vb_2. The first differential output circuit DOC_1 is coupled to the second terminal of the first current source CS_3 to receive the first current I_1, and configured to receive the first control signal CS_1 to generate output signals OS_1, OS_2 which form a differential signal. The fourth current source CS_4 comprises a first terminal, and comprises a second terminal coupled to the second predetermined voltage level GND (a ground voltage level in this embodiment). The fourth current source CS_4 drains a second current I_2 according to the first bias voltage Vb_1. The second differential output circuit DOC_2 is coupled to the first terminal of the fourth current source CS_4, and configured to receive the second control signal C_21, C_22 to generate the output signal according the second control signals C_21, C_22.

Figure 3:
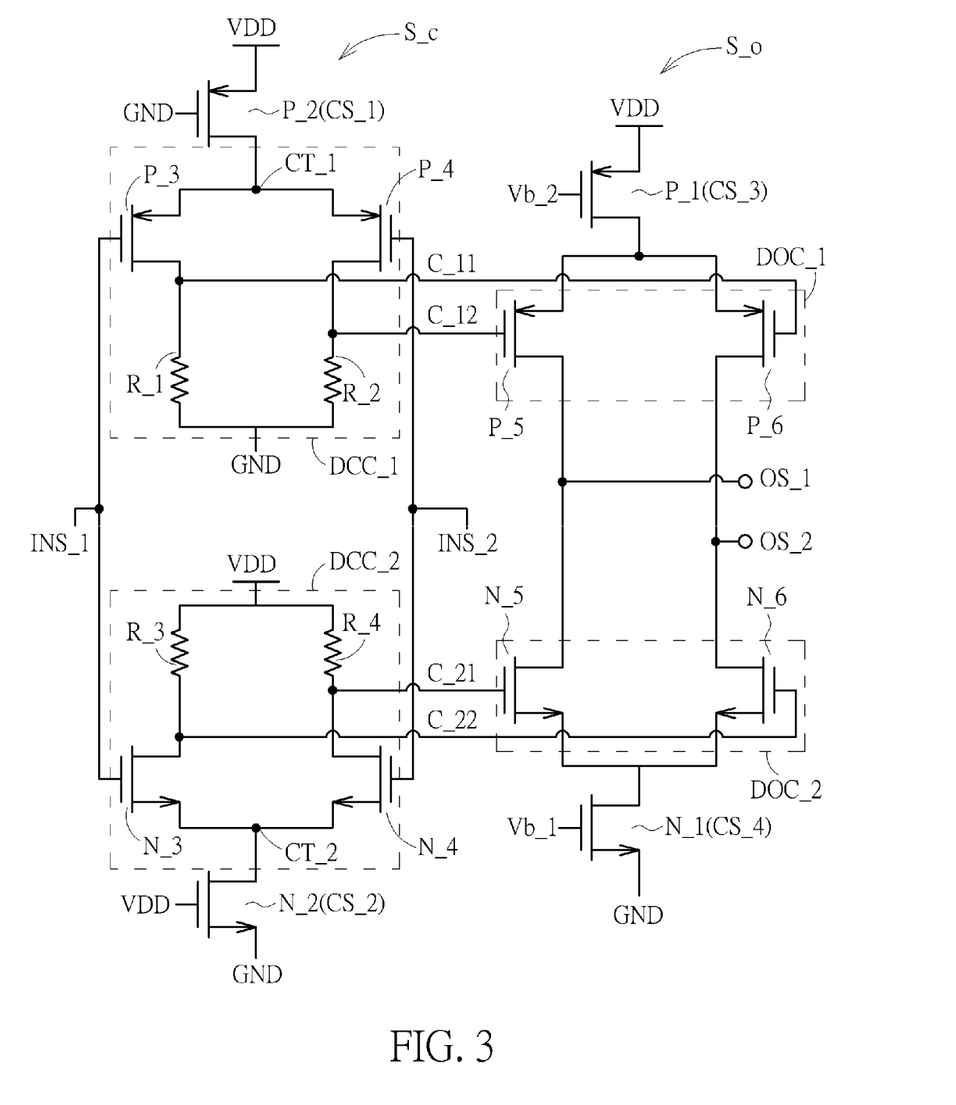
FIG. 3 is a circuit diagram illustrating a detail circuit for the embodiment depicted in FIG. 2.

FIG. 3 is a circuit diagram illustrating a detail circuit for the embodiment depicted in FIG. 2. As illustrated in FIG. 3, the first current source CS_1 comprises a second transistor of first type P_2. The second transistor of first type P_2 comprises a first terminal coupled to the first predetermined voltage level VDD, comprises a second terminal coupled to the first couple terminal CT_1, and comprises a control terminal coupled to the second predetermined voltage level GND. The second current source CS_2 comprises a second transistor of second type N_2. The second transistor of second type N_2 comprises a second terminal coupled to the second predetermined voltage level GND, comprises a first terminal coupled to the second couple terminal CT_2, and comprises a control terminal coupled to the first predetermined voltage level VDD. Please note, the second predetermined voltage level GND provided to a control terminal of the second transistor of first type P_2 is applied as a bias voltage of the second transistor of first type P_2. Similarly, the first predetermined voltage level VDD provided to a control terminal of the second transistor of second type N_2 is applied as a bias voltage of the second transistor of second type N_2.

The first differential control circuit DCC_1 comprises a third transistor of first type P_3, a first resistor R_1, a fourth transistor of first type P_4, and a second resistor R_2. The third transistor of first type P_3 comprises a first terminal coupled to the first couple terminal CT_1, comprises a second terminal outputting the first control signal C_11, and comprises a control terminal receiving the input signal INS_1. The first resistor R_1 comprises a first terminal coupled to the second terminal of the third transistor of first type P_3, and a second terminal coupled to the second predetermined voltage level GND. The fourth transistor of first type P_4 comprises a first terminal coupled to the first couple terminal CT_1, a second terminal outputting the first control signal C_12, and a control terminal receiving the input signal INS_2. The second resistor R_2 comprises a first terminal coupled to the second terminal of the fourth transistor of first type P_4, and a second terminal coupled to the second predetermined voltage level GND.

The second differential control circuit DCC_4 comprises a third resistor R_3, a third transistor of second type N_3, a fourth resistor R_4, and a fourth transistor of second type N_4. The third resistor R_3 comprises a first terminal coupled to the first predetermined voltage level VDD, and a second terminal outputting the second control signal C_22. The third transistor of second type N_3 comprises a first terminal coupled to the second terminal of the third resistor R_3, comprises a second terminal coupled to the second couple terminal CT_2, and comprises a control terminal receiving the input signal INS_1. The fourth resistor R_4 comprises a first terminal coupled to the first predetermined voltage level VDD, and a second terminal outputting the second control signal C_21. The fourth transistor of second type N_4 comprises a first terminal coupled to the second terminal of the fourth resistor R_4, a second terminal coupled to the second couple terminal CT_2, and a control terminal receiving the input signal INS_2.

Please note, in view of above-mentioned description, the first differential control circuit DCC_1 and the second differential control circuit DCC_4 operate in an input common mode.

The third current source CS_3 comprises a first transistor of first type P_1. The first transistor of first type P_1 comprises a first terminal served as the first terminal of the third current source CS_3, comprises a control terminal receiving the second bias voltage Vb_2, and comprises a second terminal served as the second terminal of the third current source CS_3. The fourth current source CS_4 comprises a first transistor of second type N_1. The first transistor of second type N_1 comprises a first terminal served as the first terminal of the fourth current source CS_4, comprises a control terminal receiving the first bias voltage Vb_1, and comprises a second terminal served as the second terminal of the fourth current source CS_4. Please note, the second bias voltage level Vb_2 provided to a control terminal of the first transistor of first type P_1 is applied as a bias voltage of the first transistor of first type P_1. Similarly, the first bias voltage level Vb_1 provided to a control terminal of the first transistor of second type N_1 is applied as a bias voltage of the first transistor of second type N_1.

Further, the first differential output circuit DOC_1 comprises a fifth transistor of first type P_5 and a sixth transistor of first type P_6. The fifth transistor of first type P_5 comprises a first terminal coupled to the second terminal of the first transistor of first type P_1, a control terminal receiving the first control signal C_12. The sixth transistor of first type P_6 comprises a first terminal coupled to the second terminal of the first transistor of first type P_1, a control terminal receiving the first control signal C_11. Either the fifth transistor of first type P_5 or the sixth transistor of first type P_6 comprises a second terminal to output the output signal OS_1, OS_2.

The second differential output circuit DOC_2 comprises a fifth transistor of second type N_5 and a sixth transistor of second type N_6. The fifth transistor of second type N_5 comprises a second terminal coupled to the first terminal of the first transistor of second type N_1, and comprises a control terminal receiving the second control signal C_21. The sixth transistor of second type N_6 comprises a second terminal coupled to the first terminal of the first transistor of second type N_1, and comprises a control terminal receiving the second control signals C_22. Either the fifth transistor of second type N_5 or the sixth transistor of second type N_6 comprises a first terminal to output the output signal OS_1, OS_2.

In one embodiment, the transistors of first type are PMOSFETs, and the transistors of second type are NMOSFETs, but not limited.

Following description will describe the operation for the input buffer circuit. Please refer to FIG. 3 again, in one embodiment, the input signal INS_1 is the reference voltage Vref, and the input signal INS_2 is Vref±Vp. The Vp is a predetermined voltage level.

If the input signals are low input, the fifth transistor of second type N_5 and the sixth transistor of second type N_6 have high turning on resistance, thus the output swing of the output stage S_o can be increased. Also, if the input signals are medium input, the fifth transistor of first type P_5, the sixth transistor of first type P_6, the fifth transistor of second type N_5 and the sixth transistor of second type N_6 have high transconductance, thus the output swing of the output stage S_o can be increased. If the input signals are high input, the second bias voltage Vb_2 increases, such that a resistance of the first transistor of first type P_1 increases. By this way, a voltage V_p2 at the second terminal of the first transistor of first type P_1 decreases. Thus, resistances of the fifth transistor of first type P_5 and the sixth transistor of first type P_6 increase. Accordingly, the total impedance for the output stage S_o increases, thus the differential gain of the output stage S_o increases. That is, the output swing of the output stage S_o can be increased. In view of above-mentioned embodiments, the input buffer circuit provided by the present application can have a high gain for different input signal levels. Therefore, reference voltage tolerance range can be extended since the output swing of the input signals is extended.

In view of above-mentioned description, the function of the first transistor of first type P_1, the fifth transistor of first type P_5, the sixth transistor of first type P_6 and the first transistor of second type N_1 are served as adjustable resistors. Also, the function of the fifth transistor of second type N_5 and the sixth transistor of second type N_6 is providing transconductance. Accordingly, the output stage S_o in FIG. 3 can be replaced by the circuit in FIG. 4. For more detail, the first transistor of first type P_1 is replaced by the first adjustable resistor AR_1, the fifth transistor of first type P_5 is replaced by the third adjustable resistor AR_3, the sixth transistor of first type P_6 is replaced by the fourth adjustable resistor AR_4 and the first transistor of second type N_1 is replaced by the second adjustable resistor AR_2.

Figure 4:
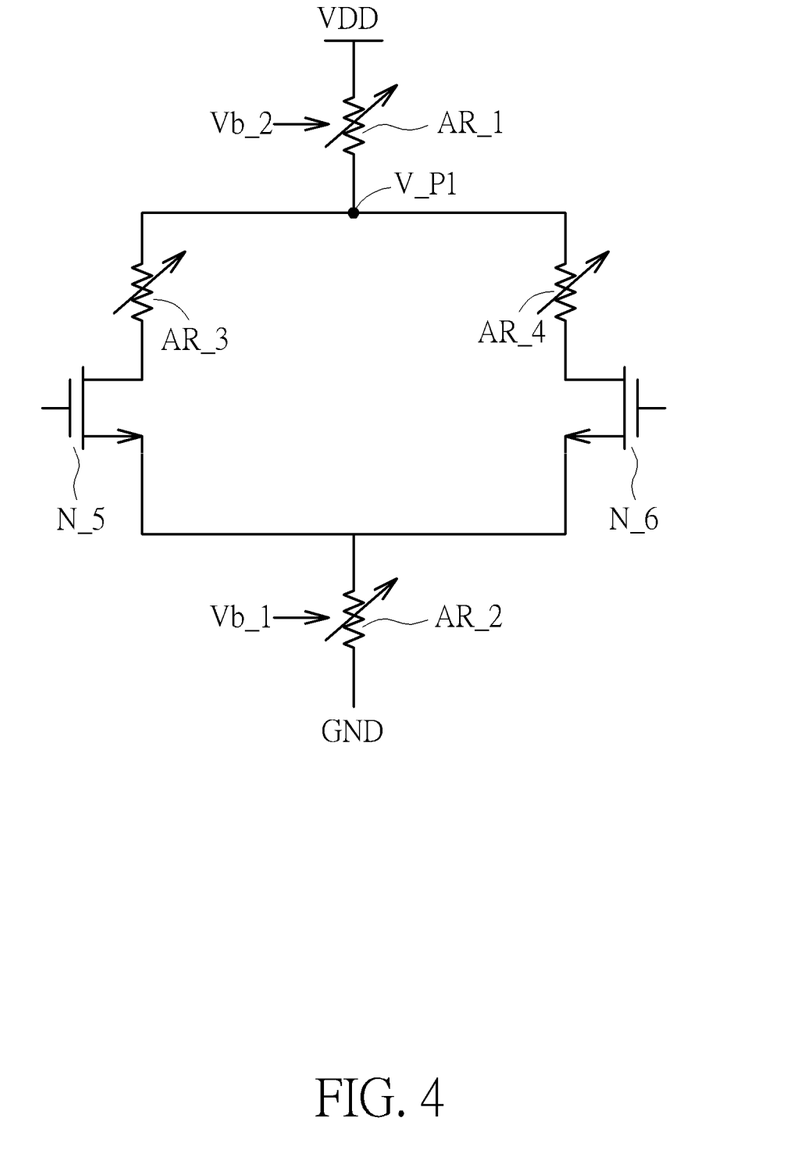
FIG. 4 is an equivalent circuit for the second stage in FIG. 2.

Therefore, in one embodiment, the output stage S_o comprises a first adjustable resistor (ex. AR_1), an adjustable resistance module (ex. AR_3, AR_4), a second adjustable resistor (ex. AR_2) and a transconductance providing circuit (ex. N_5, N_6). The first adjustable resistor AR_1 comprises a first terminal coupled to the first predetermined voltage VDD, and comprises a second terminal. A resistance value of the first adjustable resistor AR_1 changes corresponding to the second bias voltage. The adjustable resistance module (AR_3, AR_4) is coupled to the second terminal of the first adjustable resistor AR_1, configured to receive the first control signals, wherein a resistance value of the adjustable resistance module changes corresponding to the first control signals and the second bias voltage. That is, the resistance value of the adjustable resistance module (AR_3, AR_4) changes corresponding to the voltage V_p1 which is related with the second bias voltage V_b2.

The second adjustable resistor AR_2 comprises a first terminal, and comprises a second terminal coupled to the second predetermined voltage GND. A resistance value of the second adjustable resistor changes corresponding to the first bias voltage Vb_1. The transconductance providing circuit (N_5, N_6) is coupled between the adjustable resistance module (AR_3, AR_4) and the second adjustable resistor AR_2, configured to provide transconductance.

Figure 5:
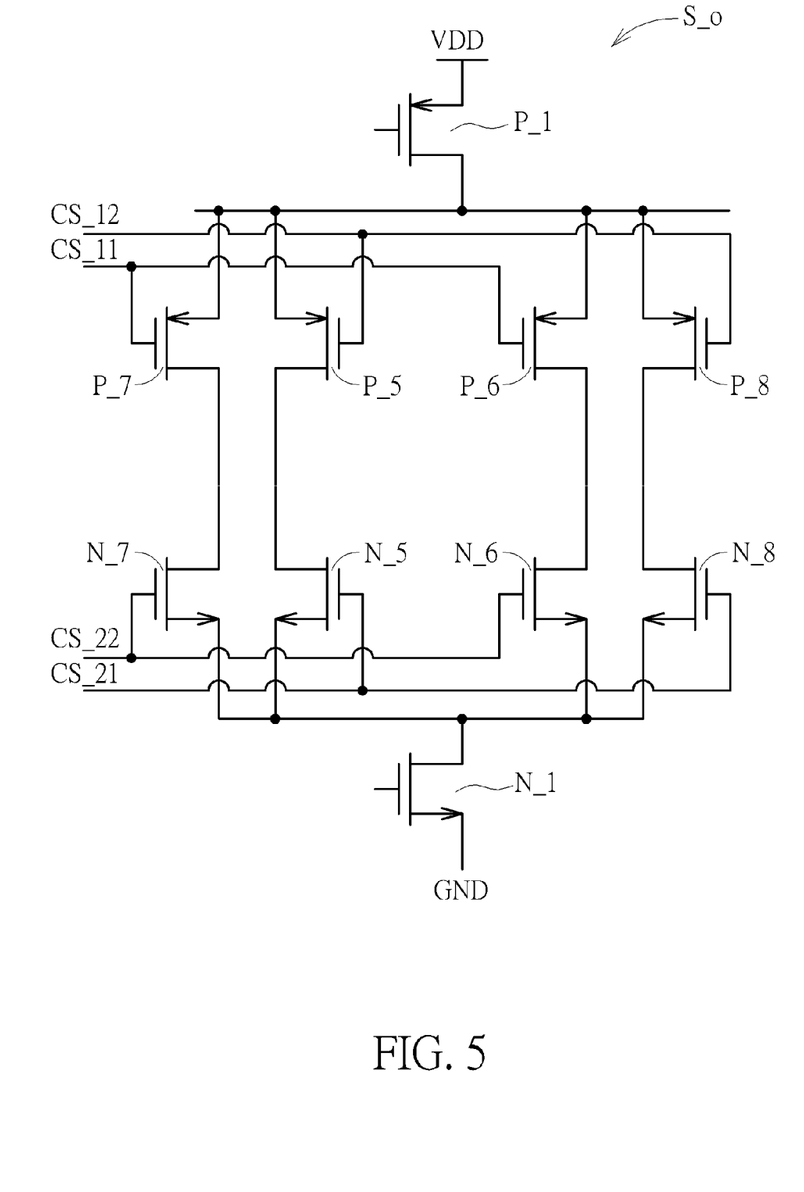
FIG. 5 is a circuit diagram illustrating the output stage according to another embodiment of the present application.

Please note, the output stage S_o in FIG. 3 can comprise other structures besides the structures depicted in FIG. 3. For example, the output stage S_o in FIG. 5 further comprises a seventh transistor of first type P_7, an eighth transistor of first type P_8, a seventh transistor of second type N_7, an eighth transistor of second type N_8 besides the devices depicted in FIG. 3. The operations and structures of the seventh transistor of first type P_7, the eighth transistor of first type P_8, the seventh transistor of second type N_7, the eighth transistor of second type N_8 are the same as which of the fifth transistor of first type P_5, the sixth transistor of first type P_6, the fifth transistor of second type N_5, the sixth transistor of second type N_6, thus are omitted for brevity here.

In view of above-mentioned embodiments, the reference voltage tolerance range can be extended, thus the requirements for receivers following different standards may be met even if only one constant reference voltage is provided. Also, better reference voltage tolerance ranges can be acquired even if the reference voltages are different.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An input buffer circuit, comprising:
 a first current source;
 a first differential control circuit, coupled to the first current source at a first couple terminal, configured to receive input signals and to generate a first bias voltage at the first couple terminal according to the input signals, and configured to generate first control signals according to the input signals;
 a second current source;
 a second differential control circuit, coupled to the second current source at a second couple terminal, configured to receive the input signals and to generate a second bias voltage at the second couple terminal according to the input signals, and configured to generate second control signals according to the input signals;
 a third current source, comprising a first terminal coupled to a first predetermined voltage level, and comprising a second terminal, wherein the third current source provides a first current according to the second bias voltage;
 a first differential output circuit, coupled to the second terminal of the third current source to receive the first current, configured to receive the first control signals to generate output signals;

a fourth current source, comprising a first terminal, and comprising a second terminal coupled to a second predetermined voltage level, wherein the fourth current source drains a second current according to the first bias voltage; and a second differential output circuit, coupled to the first terminal of the fourth current source, configured to receive the second control signals to generate the output signals.

2. The input buffer circuit of claim 1, wherein the first current source comprises:

a second transistor of first type comprising a first terminal coupled to the first predetermined voltage level, a second terminal coupled to the first couple terminal, and comprising a control terminal coupled to the second predetermined voltage level.

3. The input buffer circuit of claim 1, wherein the second current source comprises:

a second transistor of second type comprising a second terminal coupled to the second predetermined voltage level, a first terminal coupled to the second couple terminal, and comprising a control terminal coupled to the first predetermined voltage level.

4. The input buffer circuit of claim 1, wherein the third current source comprises:

a first transistor of first type, comprising a first terminal served as the first terminal of the third current source, a control terminal receiving the second bias voltage, and comprising a second terminal served as the second terminal of the third current source.

5. The input buffer circuit of claim 1, wherein the fourth current source comprises:

a first transistor of second type, comprising a first terminal served as the first terminal of the fourth current source, a control terminal receiving the first bias voltage, and comprising a second terminal served as the second terminal of the fourth current source.

6. The input buffer circuit of claim 1, wherein the first differential control circuit comprises:

a third transistor of first type, comprising a first terminal coupled to the first couple terminal, a second terminal outputting one of the first control signals, and a control terminal receiving one of the input signals;

a first resistor, comprising a first terminal coupled to the second terminal of the third transistor of first type, and a second terminal coupled to the second predetermined voltage level;

a fourth transistor of first type, comprising a first terminal coupled to the first couple terminal, a second terminal outputting one of the first control signals, and a control terminal receiving one of the input signals; and a second resistor, comprising a first terminal coupled to the second terminal of the fourth transistor of first type, and a second terminal coupled to the second predetermined voltage level.

7. The input buffer circuit of claim 1, wherein the second differential control circuit comprises:

a third resistor, comprising a first terminal coupled to the first predetermined voltage level, and a second terminal outputting the second control signal;

a third transistor of second type, comprising a first terminal coupled to the second terminal of the third resistor, a second terminal coupled to the second couple terminal, and a control terminal receiving one of the input signals;

a fourth resistor, comprising a first terminal coupled to the first predetermined voltage level, and a second terminal outputting the second control signal; and a fourth transistor of second type, comprising a first terminal coupled to the second terminal of the fourth resistor, a second terminal coupled to the second couple terminal, and a control terminal receiving one of the input signals.

8. The input buffer circuit of claim 1, wherein the first differential output circuit comprises:

a fifth transistor of first type, comprising a first terminal coupled to the second terminal of the first transistor of first type, a control terminal receiving one of the first control signals; and a sixth transistor of first type, comprising a first terminal coupled to the second terminal of the first transistor of first type, a control terminal receiving one of the first control signal.

9. The input buffer circuit of claim 1, wherein the second differential output circuit comprises:

a fifth transistor of second type, comprising a second terminal coupled to the first terminal of the first transistor of second type, and comprising a control terminal receiving one of the second control signals; and a sixth transistor of second type, comprising a second terminal coupled to the first terminal of the first transistor of second type, and comprising a control terminal receiving one of the second control signals.

10. An input buffer circuit, comprising:

a first current source;

a first differential control circuit, coupled to the first current source at a first couple terminal, configured to receive input signals and to generate a first bias voltage at the first couple terminal according to the input signals, and configured to generate a first control signal;

a second current source;

a second differential control circuit, coupled to the second current source at a second couple terminal, configured to receive the input signals and to generate a second bias voltage at the second couple terminal according to the input signals, and configured to generate second control signals;

a first adjustable resistor, comprising a first terminal coupled to the first predetermined voltage, and a second terminal, wherein a resistance value of the first adjustable resistor changes corresponding to the second bias voltage;

an adjustable resistance module, coupled to the second terminal of the first adjustable resistor, wherein a resistance value of the adjustable resistance module changes corresponding to the second bias voltage;

a second adjustable resistor, comprising a first terminal, and a second terminal coupled to the second predetermined voltage, wherein a resistance value of the second adjustable resistor changes corresponding to the first bias voltage;

a transconductance providing circuit, coupled between the adjustable resistance module and the second adjustable resistor, configured to provide transconductance.

11. The input buffer circuit of claim 10, wherein the first current source comprises a second transistor of first type comprising a first terminal coupled to the first predetermined voltage level, a second terminal coupled to the first couple terminal, and comprising a control terminal coupled to the second predetermined voltage level.

12. The input buffer circuit of claim 10, wherein the second current source comprises a second transistor of second type comprising a second terminal coupled to the second predetermined voltage level, a first terminal coupled to the second couple terminal, and comprising a control terminal coupled to the first predetermined voltage level.

13. The input buffer circuit of claim 10, wherein the first differential control circuit comprises:
- a third transistor of first type, comprising a first terminal coupled to the first couple terminal, a second terminal outputting one of the first control signals, and a control terminal receiving the one of the input signals;
- a first resistor, comprising a first terminal coupled to the second terminal of the third transistor of first type, and a second terminal coupled to the second predetermined voltage level;
- a fourth transistor of first type, comprising a first terminal coupled to the first couple terminal, a second terminal outputting one of the first control signals, and a control terminal receiving one of the input signals; and
- a second resistor, comprising a first terminal coupled to the second terminal of the fourth transistor of first type, and a second terminal coupled to the second predetermined voltage level.

14. The input buffer circuit of claim 10, wherein the second differential control circuit comprises:
- a third resistor, comprising a first terminal coupled to the first predetermined voltage level, and a second terminal outputting one of the second control signals;
- a third transistor of second type, comprising a first terminal coupled to the second terminal of the third resistor, a second terminal coupled to the second couple terminal, and a control terminal receiving one of the input signals;
- a fourth resistor, comprising a first terminal coupled to the first predetermined voltage level, and a second terminal outputting one of the second control signals;
- a fourth transistor of second type, comprising a first terminal coupled to the second terminal of the fourth resistor, a second terminal coupled to the second couple terminal, and a control terminal receiving one of the input signals.

15. The input buffer circuit of claim 10, wherein the adjustable resistance module comprises:
- a third adjustable resistor, comprising a first terminal coupled to the second terminal of the first adjustable resistor, and comprising a second terminal coupled to the transconductance providing circuit; and
- a fourth adjustable resistor, comprising a first terminal coupled to the second terminal of the first adjustable resistor, and comprising a second terminal coupled to the transconductance providing circuit;
- wherein resistance values of the third adjustable resistor and the fourth adjustable resistor change corresponding to the first control signals.

16. The input buffer circuit of claim 10, wherein the transconductance providing circuit comprises:
- a fifth transistor of second type, comprising a second terminal coupled to the first terminal of the first transistor of second type, and comprising a control terminal receiving one of the second control signals; and
- a sixth transistor of second type, comprising a second terminal coupled to the first terminal of the first transistor of second type, and comprising a control terminal receiving one of the second control signals;
- wherein the fifth transistor of second type and the sixth transistor of second type provide transconductance according to the second control signals.

* * * * *